(12) United States Patent
Verma et al.

(10) Patent No.: US 9,407,200 B2
(45) Date of Patent: Aug. 2, 2016

(54) CRYSTAL OSCILLATOR WITH LOW-POWER MODE

(75) Inventors: Ashutosh Verma, Santa Clara, CA (US); Xiaoyue Wang, Santa Clara, CA (US); Shingo Hatanaka, San Jose, CA (US); Shafiq M. Jamal, Gilroy, CA (US)

(73) Assignee: Marvell World Trade Ltd., St. Michael (BB)

( * ) Notice: Subject to any disclaimer, the term of this patent is extended or adjusted under 35 U.S.C. 154(b) by 678 days.

(21) Appl. No.: 13/220,840

(22) Filed: Aug. 30, 2011

(65) Prior Publication Data

US 2012/0098609 A1   Apr. 26, 2012

Related U.S. Application Data

(60) Provisional application No. 61/406,858, filed on Oct. 26, 2010.

(51) Int. Cl.
   *H03B 5/36* (2006.01)

(52) U.S. Cl.
   CPC .......... *H03B 5/36* (2013.01); *H03B 2200/0012* (2013.01); *H03B 2200/0046* (2013.01)

(58) Field of Classification Search
   CPC .............. H03B 5/36; H03B 5/32; H03B 5/06; H03B 2200/0046; H03B 2200/0062
   USPC ......... 331/116 R, 116 FE, 158, 160, 182, 183
   See application file for complete search history.

(56) References Cited

U.S. PATENT DOCUMENTS

| | | | |
|---|---|---|---|
| 5,844,448 A * | 12/1998 | Jackoski et al. | 331/158 |
| 6,943,639 B2 * | 9/2005 | Dahlin | 331/183 |
| 7,123,113 B1 * | 10/2006 | Brennan et al. | 331/158 |
| 7,548,128 B2 * | 6/2009 | Rosik et al. | 331/116 R |
| 2005/0007205 A1 | 1/2005 | Bridger | |

(Continued)

FOREIGN PATENT DOCUMENTS

| | | |
|---|---|---|
| CN | 1698262 A | 11/2005 |
| CN | 1761149 A | 4/2006 |
| EP | 1587211 | 10/2005 |

OTHER PUBLICATIONS

Notification of Transmittal of The International Search Report and The Written Opinion of The International Searching Authority, or The Declaration dated Nov. 3, 2011 in reference to PCT/US2011/049723 (13 pgs).

(Continued)

*Primary Examiner* — Ryan Johnson (57) ABSTRACT

Circuits having corresponding methods and computer-readable media comprise: an amplifier; a crystal port configured to be electrically coupled to a crystal, wherein a first terminal of the crystal port is electrically coupled to an input of the amplifier, and wherein a second terminal of the crystal port is electrically coupled to an output of the amplifier; a first capacitor, wherein a first terminal of the first capacitor is electrically coupled to ground; a second capacitor, wherein a first terminal of the second capacitor is electrically coupled to ground; a first switch configured to selectively electrically couple the input of the amplifier to a second terminal of the first capacitor; and a second switch configured to selectively electrically couple the output of the amplifier to a second terminal of the second capacitor.

10 Claims, 7 Drawing Sheets

(56) References Cited

U.S. PATENT DOCUMENTS

| | | |
|---|---|---|
| 2005/0083141 A1 | 4/2005 | Dahlin |
| 2006/0071730 A1 | 4/2006 | Nagatomo et al. |
| 2007/0024385 A1* | 2/2007 | Greenberg .................... 331/158 |
| 2008/0252390 A1 | 10/2008 | Guerreiro |
| 2009/0085685 A1 | 4/2009 | Guo et al. |

OTHER PUBLICATIONS

First Office Action mailed Mar. 2, 2015 corresponding to Chinese Patent Application No. 201180051715.4, 18 pages.

Examination Report dated Sep. 1, 2015 corresponding to European Patent Application No. 11760903.2, 5 pages.

* cited by examiner

CRYSTAL OSCILLATOR WITH LOW-POWER MODE

CROSS-REFERENCE TO RELATED APPLICATIONS

This disclosure claims the benefit of U.S. Provisional Patent Application Ser. No. 61/406,858, filed on Oct. 26, 2010, entitled "XTAL SLEEP MODE," the disclosure thereof incorporated by reference herein in its entirety.

FIELD

The present disclosure relates generally to the field of crystal oscillators. More particularly, the present disclosure relates to reducing the power consumption of such oscillators.

BACKGROUND

Figure 1:
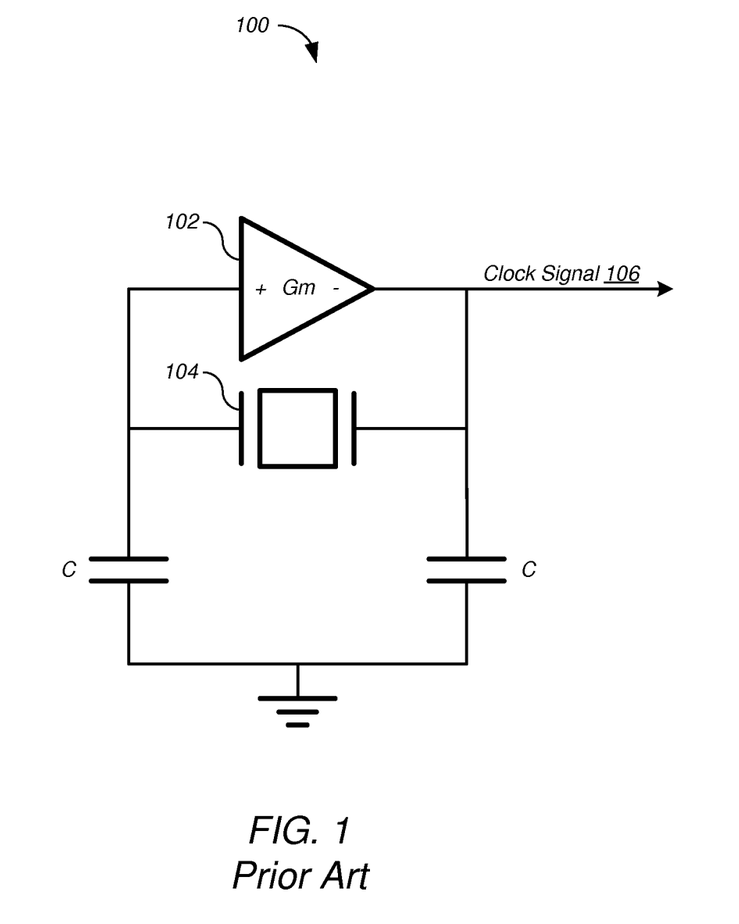
FIG. 1 shows a conventional Pierce oscillator.

Many circuits require an accurate reference clock signal. One popular circuit for providing such a clock signal is the Pierce oscillator, which is shown in FIG. 1. Referring to FIG. 1, the Pierce oscillator includes an amplifier 102 and a crystal 104 connected in parallel, with each side connected to ground by a respective load capacitor C. The output of amplifier 102 provides a clock signal 106. The Pierce oscillator is often implemented within the integrated circuit to be clocked, with the exception of crystal 104, which is implemented externally.

With the increasing prevalence of mobile devices, power consumption has become a major concern. Many integrated circuits for such mobile devices now feature a low-power mode in which the power consumption of the integrated circuit is greatly reduced. Conventional integrated circuits having such a low-power mode generally disconnect the internal Pierce oscillator to save power, and instead rely on an external clock circuit while in low-power mode.

SUMMARY

In general, in one aspect, an embodiment features a circuit comprising: an amplifier; a crystal port configured to be electrically coupled to a crystal, wherein a first terminal of the crystal port is electrically coupled to an input of the amplifier, and wherein a second terminal of the crystal port is electrically coupled to an output of the amplifier; a first capacitor, wherein a first terminal of the first capacitor is electrically coupled to ground; a second capacitor, wherein a first terminal of the second capacitor is electrically coupled to ground; a first switch configured to selectively electrically couple the input of the amplifier to a second terminal of the first capacitor; and a second switch configured to selectively electrically couple the output of the amplifier to a second terminal of the second capacitor.

Embodiments of the circuit can include one or more of the following features. Some embodiments comprise an oscillator controller configured to control the first and second switches. In some embodiments, the oscillator controller comprises: a switch controller configured to control the first and second switches; wherein the switch controller closes the first and second switches responsive to a power mode signal indicating a transition to a first power mode, and wherein the switch controller opens the switches responsive to the power mode signal indicating a transition to a second power mode. In some embodiments, the oscillator controller further comprises: an amplifier controller configured to control an amplitude of a signal at the output of the amplifier. In some embodiments, the amplifier controller comprises: a variable current source configured to provide an electrical current to a current input of the amplifier, and to vary the amplitude of the signal at the output of the amplifier by varying a level of the electrical current in response to the power mode signal. In some embodiments, the first power mode is a full-power mode and the second power mode is a low-power mode. In some embodiments, the variable current source comprises: a current digital-to-analog converter configured to provide the electrical current to the current input of the amplifier, and to control the amplitude of the signal at the output of the amplifier by varying the level of the electrical current in accordance with a digital word, wherein the amplifier controller is further configured to change the digital word based on the amplitude of the signal at the output of the amplifier. In some embodiments, the amplifier controller further comprises: a peak detector configured to measure the amplitude of the signal at the output of the amplifier. In some embodiments, the amplifier controller is further configured to control the amplitude of the signal at the output of the amplifier according to a first amplitude target during the first power mode, and to control the amplitude of the signal at the output of the amplifier according to a second amplitude target during the second power mode. Some embodiments comprise an integrated circuit comprising the circuit. Some embodiments comprise a device comprising: the integrated circuit and the crystal.

In general, in one aspect, an embodiment features a method for controlling an oscillator, wherein the oscillator includes an amplifier; a crystal oscillator, wherein a first terminal of the crystal oscillator is electrically coupled to an input of the amplifier, and wherein a second terminal of the crystal oscillator is electrically coupled to an output of the amplifier; a first capacitor, wherein a first terminal of the first capacitor is electrically coupled to ground; a second capacitor, wherein a first terminal of the second capacitor is electrically coupled to ground; and wherein the method comprises: selectively electrically coupling the input of the amplifier to a second terminal of the first capacitor; and selectively electrically coupling the output of the amplifier to a second terminal of the second capacitor.

Embodiments of the method can include one or more of the following features. Some embodiments comprise electrically coupling the input of the amplifier to the second terminal of the first capacitor, and electrically coupling the output of the amplifier to the second terminal of the second capacitor, responsive to a power mode signal indicating a transition to a first power mode; and electrically decoupling the input of the amplifier from the second terminal of the first capacitor, and electrically decoupling the output of the amplifier from the second terminal of the second capacitor, responsive to the power mode signal indicating a transition to a second power mode. In some embodiments, the first power mode is a full-power mode and the second power mode is a low-power mode. Some embodiments comprise controlling an amplitude of a signal at the output of the amplifier. In some embodiments, controlling the amplitude of the signal at the output of the amplifier comprises: varying a level of an electrical current provided to a current input of the amplifier in response to the power mode signal. In some embodiments, controlling the amplitude of the signal at the output of the amplifier further comprises: controlling the amplitude of the signal at the output of the amplifier according to a first amplitude target during the first power mode, or according to a second amplitude target during the second power mode.

In general, in one aspect, an embodiment features computer-readable media embodying instructions executable by a computer to perform functions for controlling an oscillator, wherein the oscillator includes an amplifier; a crystal oscillator, wherein a first terminal of the crystal oscillator is electrically coupled to an input of the amplifier, and wherein a second terminal of the crystal oscillator is electrically coupled to an output of the amplifier; a first capacitor, wherein a first terminal of the first capacitor is electrically coupled to ground; a second capacitor, wherein a first terminal of the second capacitor is electrically coupled to ground; and wherein the functions comprise: selectively electrically coupling the input of the amplifier to a second terminal of the first capacitor; and selectively electrically coupling the output of the amplifier to a second terminal of the second capacitor.

Embodiments of the computer-readable media can include one or more of the following features. In some embodiments, the functions for controlling the oscillator further comprise: electrically coupling the input of the amplifier to the second terminal of the first capacitor, and electrically coupling the output of the amplifier to the second terminal of the second capacitor, responsive to a power mode signal indicating a transition to a first power mode; and electrically decoupling the input of the amplifier from the second terminal of the first capacitor, and electrically decoupling the output of the amplifier from the second terminal of the second capacitor, responsive to the power mode signal indicating a transition to a second power mode. In some embodiments, the functions further comprise: controlling an amplitude of a signal at the output of the amplifier. In some embodiments, controlling the amplitude of the signal at the output of the amplifier comprises: varying a level of an electrical current provided to a current input of the amplifier in accordance with the amplitude of the signal at the output of the amplifier.

The details of one or more implementations are set forth in the accompanying drawings and the description below. Other features will be apparent from the description and drawings, and from the claims.

The leading digit(s) of each reference numeral used in this specification indicates the number of the drawing in which the reference numeral first appears.

DETAILED DESCRIPTION

Embodiments of the present disclosure provide crystal oscillators having a low-power mode. In the low-power mode, the power consumed by the oscillator is reduced according to the techniques described below. These techniques include removing the load capacitors. The Pierce oscillator has a negative resistance R that is given by equation (1).

$$R \propto \frac{g_m}{\omega^2 C_L^2} \quad (1)$$

where $g_m$ represents the transconductance of the amplifier, $\omega$ represents the resonant frequency of the oscillator, and $C_L$ represents the capacitance of each load capacitor. As can be seen from equation (1), removing the load capacitors allows a reduction in transconductance $g_m$ while keeping negative resistance R constant.

These described techniques also include selecting the lowest clock signal amplitude that meets low-power mode clock requirements. In full-power mode, the clock signal amplitude is set at a relatively high value (for example, above 1 Vpp) to meet the stringent jitter requirements of full-power mode (for example, 1 ppm). In low-power mode, jitter requirements are relaxed (for example, 150 ppm), allowing the clock signal amplitude to be set at a relatively low value (for example, below 300 mVpp). Removing the load capacitors and reducing the clock signal amplitude allow a reduction in transconductance $g_m$, resulting in a reduction in power consumption.

Figure 2:
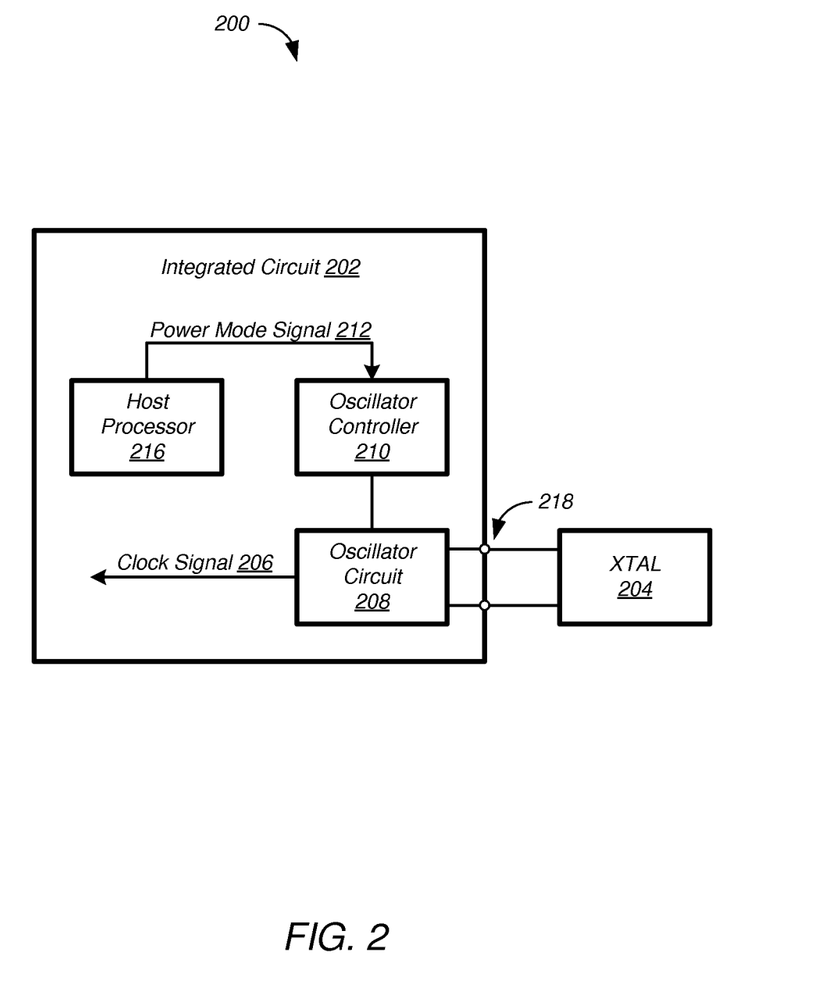
FIG. 2 shows elements of a device that includes a crystal oscillator with a low-power mode according to one embodiment.

FIG. 2 shows elements of a device 200 that includes a crystal oscillator with a low-power mode according to one embodiment. Although in the described embodiments the elements of device 200 are presented in one arrangement in FIG. 2, other embodiments may feature other arrangements. For example, elements of device 200 can be implemented in hardware, software, or combinations thereof.

Referring to FIG. 2, device 200 includes an integrated circuit 202 and a crystal (XTAL) 204. Integrated circuit 202 can be implemented as any sort of circuit, for example such as a WiFi or Bluetooth transceiver or the like. Device 200 can be implemented as any sort of electronic device, for example such as a smartphone, tablet or other computer, or the like. Crystal 204 can be implemented as a quartz crystal or the like. Integrated circuit 202 includes a two-terminal crystal port 218 configured to be electrically coupled to crystal 204. Integrated circuit 202 also includes an oscillator circuit 208, an oscillator controller 210, and a host processor 216. Host processor 216 provides a power mode signal 212 that indicates the current power mode for integrated circuit 202. Oscillator controller 210 controls oscillator circuit 208 in accordance with power mode signal 212. Oscillator circuit 208 provides a clock signal 206. Clocked circuits within integrated circuit 202 operate according to clock signal 206.

Figure 3:
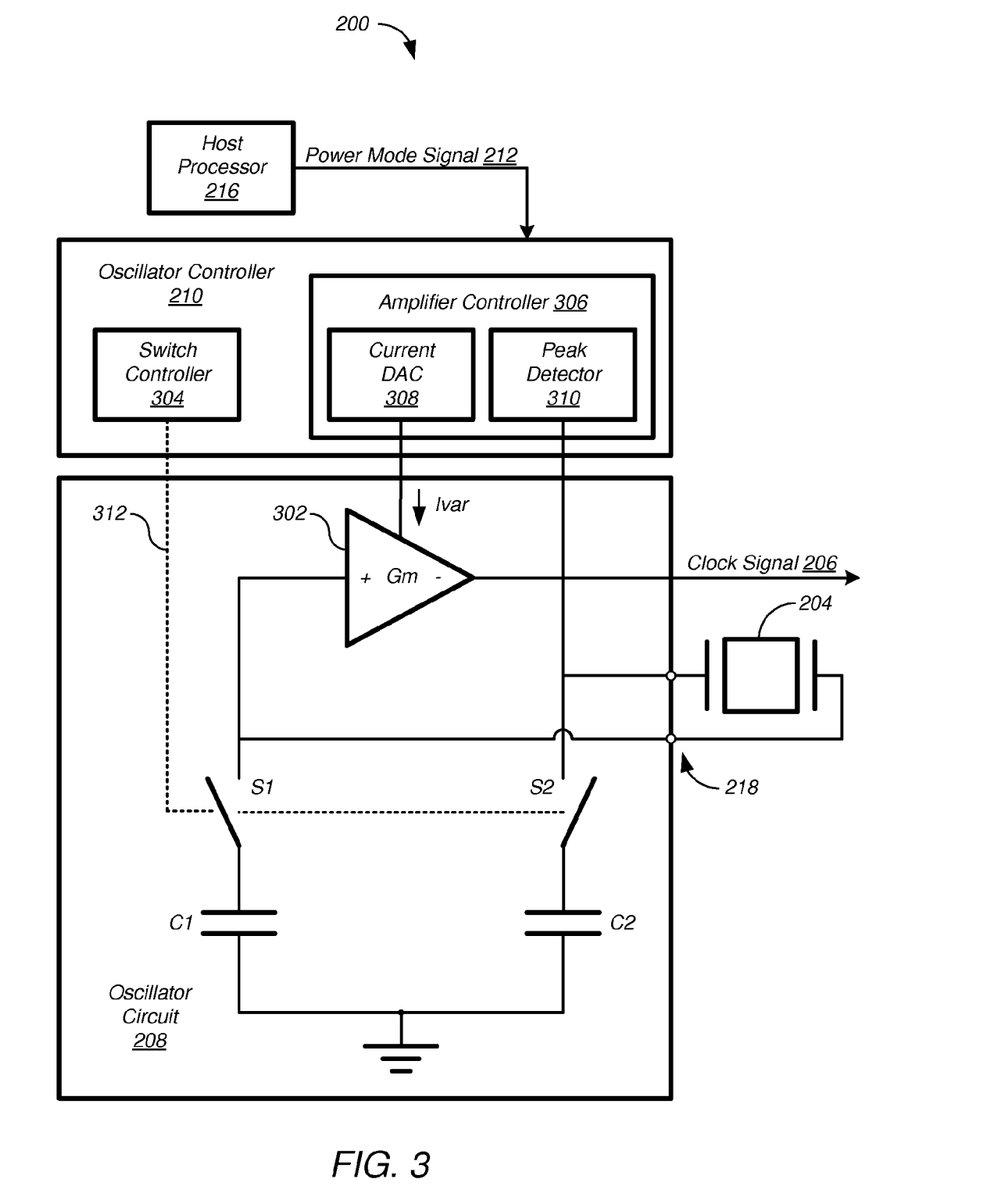
FIG. 3 shows detail of the device of FIG. 2 according to one embodiment.

FIG. 3 shows detail of device 200 of FIG. 2 according to one embodiment. Although in FIG. 3 the elements of device 200 are presented in one arrangement in FIG. 3, other embodiments may feature other arrangements. For example, elements of device 200 can be implemented in hardware, software, or combinations thereof.

Referring to FIG. 3, oscillator circuit 208 includes a transconductance (Gm) amplifier 302 electrically coupled in parallel with crystal 204, two capacitors C1 and C2 each electrically coupled to ground, and two switches S1 and S2 for electrically coupling capacitors C1 and C2 to the input and output, respectively, of amplifier 302 in accordance with a switch control signal 312. In some embodiments, each capacitor C1, C2 has a capacitance in the 10 pF range. Other embodiments can have other capacitance values.

Device 200 includes oscillator circuit 208, crystal 204, host processor 216, and oscillator controller 210. Oscillator controller 210 includes a switch controller 304 and an amplifier controller 306. Switch controller 304 provides switch control signal 312. Amplifier controller 306 includes a variable current source and a peak detector 310. In the embodiment of FIG. 3, the variable current source is implemented as a current digital-to-analog converter (DAC) 308. The output of amplifier 302 provides clock signal 206. Peak detector 310 measures the amplitude of clock signal 206. Current DAC 308 provides a variable current Ivar to a current input of amplifier 302.

In the embodiment of FIG. 3, device 200 has a full-power mode and a low-power mode. For example, device 200 can be implemented as a smartphone or the like, and the low-power mode can be a sleep mode of the smartphone. Host processor 216 determines the power mode, and indicates the determined power mode with power mode signal 212.

Oscillator controller 210 controls oscillator circuit 208 in accordance with power mode signal 212. When power mode signal 212 indicates a transition to full-power mode, switch controller 304 closes switches S1 and S2, and current DAC 308 provides current Ivar to the current input of amplifier 302 at a level sufficient to cause the amplitude of clock signal 206 to meet full-power mode clock requirements.

When power mode signal 212 indicates a transition to low-power mode, switch controller 304 opens switches S1 and S2, and current DAC 308 provides current Ivar to the current input of amplifier 302 at a lower level that is sufficient to cause the amplitude of clock signal 206 to meet low-power mode clock requirements.

Figure 4:
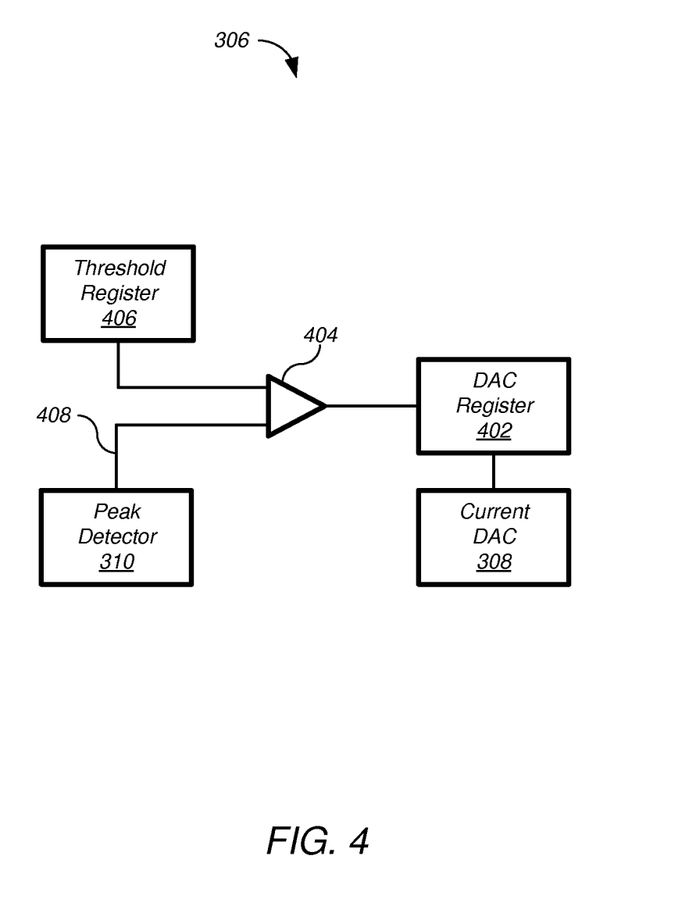
FIG. 4 shows detail of the amplitude controller of FIG. 3 according to one embodiment.

FIG. 4 shows detail of amplitude controller 306 of FIG. 3 according to one embodiment. Although in FIG. 4 the elements of amplitude controller 306 are presented in one arrangement in FIG. 4, other embodiments may feature other arrangements. For example, elements of amplitude controller 306 can be implemented in hardware, software, or combinations thereof. Furthermore, while FIG. 4 depicts an embodiment using digital words, other embodiments employ analog signals in place of the digital words.

Referring to FIG. 4, amplitude controller 306 includes current DAC 308, peak detector 310, a DAC register 402, a comparator 404, and a threshold register 406. Responsive to power mode signal 212, amplifier controller 306 provides an amplitude target to comparator 404. In particular, amplifier controller 306 writes a threshold word to threshold register 406. Amplifier controller 306 has a different amplitude target for each power mode. In particular, amplifier controller 306 writes a full-power threshold word to threshold register 406 to transition to full-power mode, and writes a low-power threshold word to threshold register 406 to transition to low-power mode.

Peak detector 310 provides a word 408 representing the current amplitude of clock signal 206. Comparator 404 compares the current amplitude and the current threshold word, and changes the digital word in DAC register 402 accordingly. In particular, comparator 404 compares the word 408 representing the current amplitude of clock signal 206 with the word in threshold register 406. When word 408 is larger than the word in threshold register 406, comparator 404 decrements DAC register 402. When word 408 is smaller than the word in threshold register 406, comparator 404 increments DAC register 402.

Figure 5:
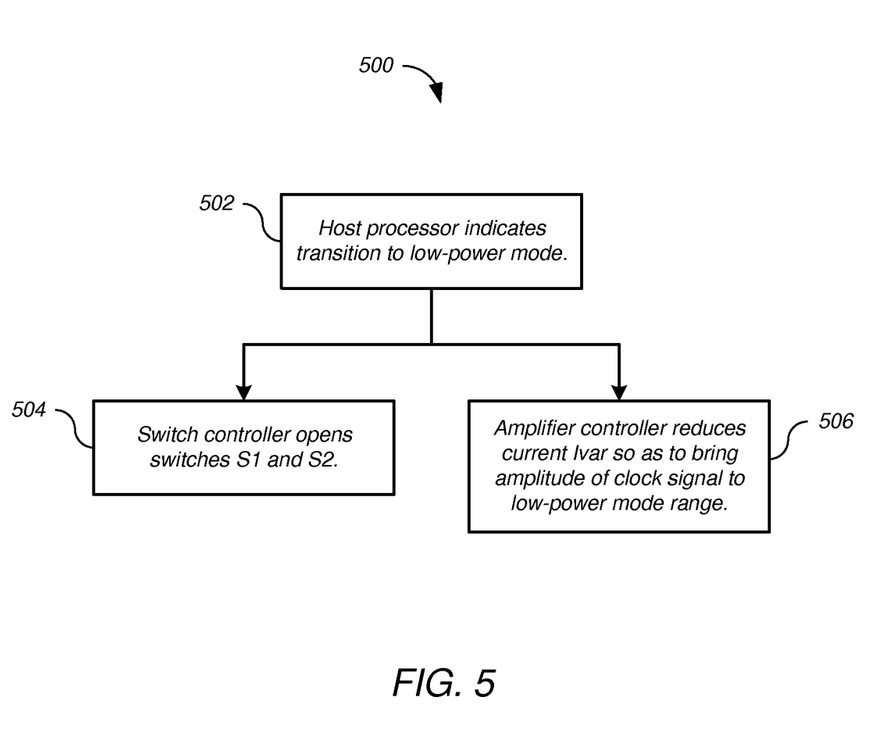
FIG. 5 shows a process for a transition from full-power mode to low-power mode for the device of FIGS. 2-4 according to one embodiment.
Figure 6:
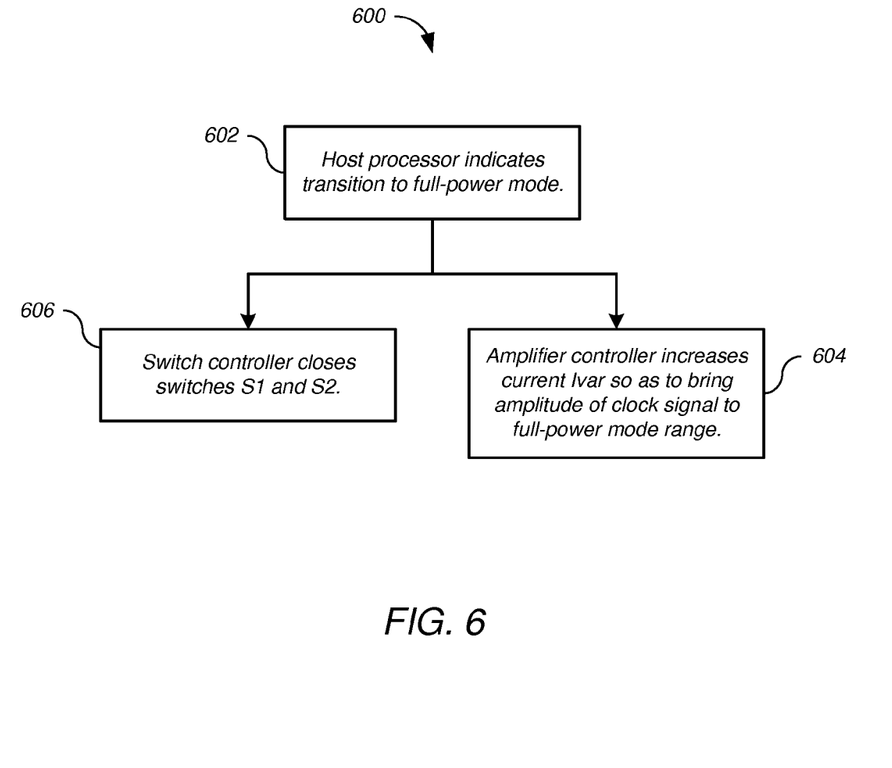
FIG. 6 shows a process for a transition from low-power mode to full-power mode for the device of FIGS. 2-4 according to one embodiment.
Figure 7:
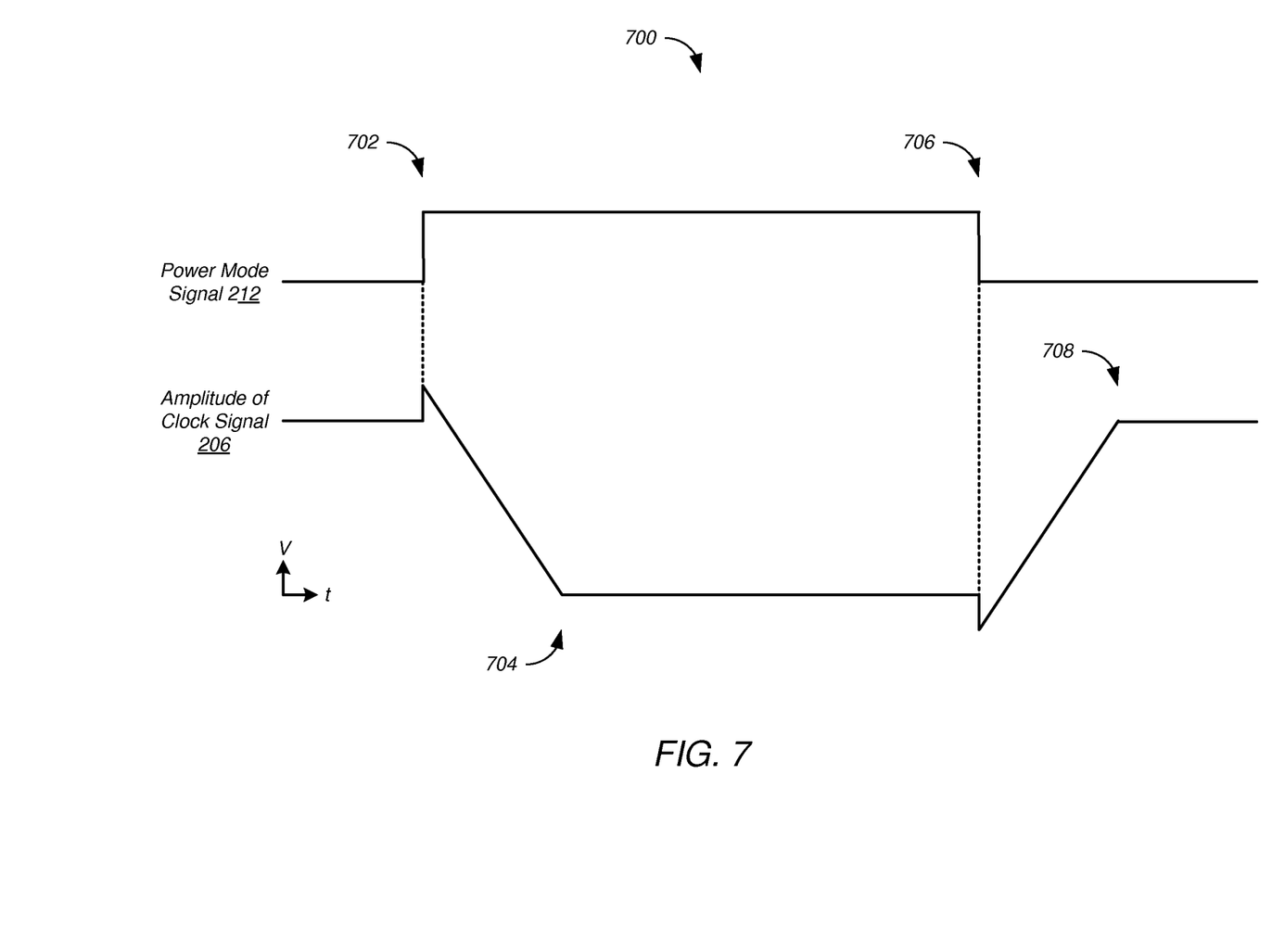
FIG. 7 is a signal diagram illustrating the transitions of FIGS. 5 and 6.

FIG. 5 shows a process 500 for a transition from full-power mode to low-power mode for device 200 of FIGS. 2-4 according to one embodiment. FIG. 6 shows a process 600 for a transition from low-power mode to full-power mode for device 200 of FIGS. 2-4 according to one embodiment. FIG. 7 is a signal diagram illustrating the transitions of FIGS. 5 and 6. Although in the described embodiments the elements of processes 500 and 600 are presented in one arrangement, other embodiments may feature other arrangements. For example, in various embodiments, some or all of the elements of processes 500 and 600 can be executed in a different order, concurrently, and the like.

Referring to FIGS. 2 and 5, host processor 216 indicates the transition to low-power mode using power mode signal 212 at 502. Referring to FIGS. 2 and 7, power mode signal 212 is a bi-level signal where the low level indicates full-power mode and the high level indicates low-power mode. At 702 power mode signal 212 indicates the transition to low-power mode by transitioning from low to high.

Responsive to the transition of power mode signal 212 from low to high, switch controller 304 opens switches S1 and S2 at 504. Also responsive to power mode signal 212, at 506 amplifier controller 306 reduces current Ivar so as to bring the amplitude of clock signal 206 to a low-power mode range. In particular, amplifier controller 306 writes a low-power mode threshold word to threshold register 406. During the transition from full-power mode to low-power mode, the word 408 representing the amplitude of clock signal 206 is larger than the low-power mode threshold word in threshold register 406. Comparator 404 therefore causes the word in DAC register 402 to decrease until the amplitude of clock signal 206 is within the low-power mode range. Referring to FIG. 7, the amplitude of clock signal 206 first rises slightly in response to the disconnection of load capacitors C1 and C2, then ramps down as the word in DAC register 402 is decremented, until the word in DAC register 402 and the word in threshold register 406 are equal at 704.

Referring to FIG. 6, host processor 216 indicates the transition to low-power mode using power mode signal 212 at 602. Referring to FIG. 7, at 706 power mode signal 212 indicates the transition to full-power mode by transitioning from high to low.

Responsive to the transition of power mode signal 212 from high to low, switch controller 304 closes switches S1 and S2 at 604. Also responsive to power mode signal 212, at 606 amplifier controller 306 increases current Ivar so as to bring the amplitude of clock signal 206 within a full-power mode range. In particular, amplifier controller 306 writes a full-power mode threshold word to threshold register 406. During the transition from full-power mode to low-power mode, the word 408 representing the amplitude of clock signal 206 is smaller than the full-power mode threshold word in threshold register 406. Comparator 404 therefore causes the word in DAC register 402 to increase until the amplitude of clock signal 206 is within the full-power mode range. Referring to FIG. 7, the amplitude of clock signal 206 first falls slightly in response to the connection of load capacitors C1 and C2, then ramps up as the word in DAC register 402 is incremented, until the word in DAC register 402 and the word in threshold register 406 are equal at 708.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. A circuit comprising:
   an amplifier;
   a crystal port configured to be electrically coupled to a crystal, wherein a first terminal of the crystal port is electrically coupled to an input of the amplifier, and wherein a second terminal of the crystal port is electrically coupled to an output of the amplifier;
   a first capacitor, wherein a first terminal of the first capacitor is electrically coupled to ground;
   a second capacitor, wherein a first terminal of the second capacitor is electrically coupled to ground;
   a first switch configured to selectively electrically couple the input of the amplifier to a second terminal of the first capacitor;
   a second switch configured to selectively electrically couple the output of the amplifier to a second terminal of the second capacitor; and
   an oscillator controller configured to
      in response to a power mode signal indicating a transition to a low power mode, i) open the first switch and the second switch, and ii) decrease a peak amplitude of a signal at the output of the amplifier to a first amplitude target, and
      in response to the power mode signal indicating a transition to a full power mode, i) close the first switch and the second switch, and ii) increase the peak amplitude of the signal at the output of the amplifier to a second amplitude target that is greater than the first amplitude target,
      wherein the oscillator controller includes an amplifier controller configured to control the increase and decrease of the peak amplitude of the signal at the output of the amplifier, and
      wherein, to control the increase and decrease of the peak amplitude of the signal at the output of the amplifier, the amplifier controller includes
         a first register, wherein the amplifier controller is configured to write a threshold word indicating a selected one of the first amplitude target and the second amplitude target to the first register,
         a peak detector configured to provide, as a digital word, an amplitude of the signal at the output of the amplifier, and
         a comparator configured to (i) compare the digital word corresponding to the amplitude to the threshold word indicating the selected one of the first amplitude target and the second amplitude target, (ii) decrement a digital word stored in a second register when the digital word corresponding to the amplitude is greater than the threshold word, and (iii) increment the digital word stored in the second register when the digital word corresponding to the amplitude is less than the threshold word.

2. The circuit of claim 1, wherein the oscillator controller comprises:
   a switch controller configured to control the first switch and the second switch; wherein the switch controller opens and closes the first switch and the second switch responsive to the power mode signal.

3. The circuit of claim 1, wherein the amplifier controller comprises:
   a variable current source configured to provide an electrical current to a current input of the amplifier, and to vary the peak amplitude of the signal at the output of the amplifier by varying a level of the electrical current in response to the power mode signal.

4. The circuit of claim 3, wherein the variable current source comprises:
   a current digital-to-analog converter configured to provide the electrical current to the current input of the amplifier, and to control the peak amplitude of the signal at the output of the amplifier by varying the level of the electrical current in accordance with the digital word.

5. An integrated circuit comprising the circuit of claim 1.

6. A device comprising:
   the integrated circuit of claim 5; and
   the crystal.

7. A method for controlling an oscillator, wherein the oscillator includes
   an amplifier;
   a crystal oscillator, wherein a first terminal of the crystal oscillator is electrically coupled to an input of the amplifier, and wherein a second terminal of the crystal oscillator is electrically coupled to an output of the amplifier;
   a first capacitor, wherein a first terminal of the first capacitor is electrically coupled to ground;
   a second capacitor, wherein a first terminal of the second capacitor is electrically coupled to ground;
   and wherein the method comprises:
      in response to a power mode signal indicating a transition to a full power mode,
         i) selectively electrically connecting the input of the amplifier to a second terminal of the first capacitor,
         ii) selectively electrically connecting the output of the amplifier to a second terminal of the second capacitor, and iii) increasing a peak amplitude of a signal at the output of the amplifier to a first amplitude target; and
      in response to the power mode signal indicating a transition to a lower power mode,
         i) electrically disconnecting the input of the amplifier from the second terminal of the first capacitor, ii) electrically disconnecting the output of the amplifier from the second terminal of the second capacitor, and iii) decreasing the peak amplitude of the signal at the output of the amplifier to a second amplitude target that is less than the first amplitude target,
      wherein increasing and decreasing the peak amplitude of the signal at the output of the amplifier includes writing, to a first register, a threshold word indicating a selected one of the first amplitude target and the second amplitude target, using a peak detector, providing, as a digital word, an amplitude of the signal at the output of the amplifier, and using a comparator, (i) comparing the digital word correspond to the amplitude to the threshold word indicating the selected one of the first amplitude target and the second amplitude target, (ii) decrementing a digital word stored in a second register when the digital word corresponding to the amplitude is greater than the threshold word, and (iii) incrementing the digital word stored in the register when the digital word corresponding to the amplitude is less than the threshold word.

8. The method of claim 7, wherein increasing and decreasing the peak amplitude of the signal at the output of the amplifier comprises:

varying a level of an electrical current provided to a current input of the amplifier in response to the power mode signal.

9. Non-transitory computer-readable media embodying instructions executable by a computer to perform functions for controlling an oscillator, wherein the oscillator includes an amplifier;

a crystal oscillator, wherein a first terminal of the crystal oscillator is electrically coupled to an input of the amplifier, and wherein a second terminal of the crystal oscillator is electrically coupled to an output of the amplifier;

a first capacitor, wherein a first terminal of the first capacitor is electrically coupled to ground;

a second capacitor, wherein a first terminal of the second capacitor is electrically coupled to ground; and wherein the functions comprise:

in response to a power mode signal indicating a transition to a full power mode,
i) selectively electrically connecting the input of the amplifier to a second terminal of the first capacitor, ii) selectively electrically connecting the output of the amplifier to a second terminal of the second capacitor, and iii) increasing a peak amplitude of a signal at the output of the amplifier to a first amplitude target; and in response to the power mode signal indicating a transition to a lower power mode,
i) electrically disconnecting the input of the amplifier from the second terminal of the first capacitor, ii) electrically disconnecting the output of the amplifier from the second terminal of the second capacitor, and iii) decreasing the peak amplitude of the signal at the output of the amplifier to a second amplitude target that is less than the first amplitude target, wherein increasing and decreasing the peak amplitude of the signal at the output of the amplifier includes
writing, to a first register, a threshold word indicating a selected one of the first amplitude target and the second amplitude target, using a peak detector, providing, as a digital word, an amplitude of the signal at the output of the amplifier, and using a comparator, (i) comparing the digital word correspond to the amplitude to the threshold word indicating the selected one of the first amplitude target and the second amplitude target, (ii) decrementing a digital word stored in a second register when the digital word corresponding to the amplitude is greater than the threshold word, and (iii) incrementing the digital word stored in the register when the digital word corresponding to the amplitude is less than the threshold word.

10. The computer-readable media of claim 9, wherein increasing and decreasing the peak amplitude of the signal at the output of the amplifier comprises:

varying a level of an electrical current provided to a current input of the amplifier in accordance with the peak amplitude of the signal at the output of the amplifier.

* * * * *